US012695069B2

(12) United States Patent    (10) Patent No.:   US 12,695,069 B2

Usui et al.        (45) Date of Patent:     Jul. 28, 2026

(54) HOLDING DEVICE

(71) Applicant: Niterra Co., Ltd., Nagoya (JP)

(72) Inventors: Shun Usui, Nagoya (JP); Shiro Inoue, Nagoya (JP); Sumio Ota, Nagoya (JP); Honami Ohara, Nagoya (JP); Takumi Sanari, Nagoya-shi (JP)

(73) Assignee: NITERRA CO., LTD., Nagoya (JP)

( * ) Notice: Subject to any disclaimer, the term of this patent is extended or adjusted under 35 U.S.C. 154(b) by 0 days.

(21) Appl. No.: 18/726,237

(22) PCT Filed: Jun. 21, 2023

(86) PCT No.: PCT/JP2023/022899

§ 371 (c)(1),
(2) Date: Jul. 2, 2024

(87) PCT Pub. No.: WO2024/009768

PCT Pub. Date: Jan. 11, 2024

(65) Prior Publication Data

US 2025/0125126 A1     Apr. 17, 2025

(30) Foreign Application Priority Data

Jul. 7, 2022    (JP) ................................. 2022-109776

(51) Int. Cl.
    *H01J 37/32*       (2006.01)
(52) U.S. Cl.
    CPC .... *H01J 37/32715* (2013.01); *H01J 37/3244* (2013.01)
(58) Field of Classification Search
    None
    See application file for complete search history.

(56) References Cited

U.S. PATENT DOCUMENTS

2022/0181183 A1*   6/2022   Kawase  ............. H01L 21/3065

FOREIGN PATENT DOCUMENTS

| | | |
|---|---|---|
| JP | 4959905 B2 | 6/2012 |
| JP | 2017-538278 A | 12/2017 |
| WO | 2020/203680 A1 | 10/2020 |

OTHER PUBLICATIONS

Japan Patent Office, International Search Report issued in corresponding Application No. PCT/JP2023/022899 mailed Sep. 12, 2023.

(Continued)

*Primary Examiner* — Elizabeth Collister

(74) *Attorney, Agent, or Firm* — Stites & Harbison, PLLC; Jeffrey A. Haeberlin

(57) ABSTRACT

A holding device includes a ceramic substrate including a plate-shaped member containing ceramics as a main component and including a first surface for holding an object and a gas flow path formed therein. The gas flow path includes, in a part thereof, a porous region that is a region in which a gas-permeable porous body that contains ceramics as a main component and includes a large number of pores is disposed. The porous body includes, as the pores, a large number of large-diameter pores whose median particle diameter is greater than 20 μm and less than or equal to 55 μm and a large number of small-diameter pores whose median particle diameter is greater than or equal to 3 μm and less than or equal to 20 μm. A volume percent of the large-diameter pores is greater than a volume percent of the small-diameter pores.

3 Claims, 6 Drawing Sheets

(56)　　　　　　　　References Cited

OTHER PUBLICATIONS

Taiwan Intellectual Property Office, Ministry of Econominc Affairs, Notification for the Opinion of Examination issued in corresponding Application No. 112125040 dated May 26, 2026.

* cited by examiner

HOLDING DEVICE

TECHNICAL FIELD

The present invention relates to a holding device.

BACKGROUND ART

For example, PTL 1 describes an electrostatic chuck that is an example of a holding device for holding a wafer when manufacturing a semiconductor. An electrostatic chuck of this type includes a ceramic substrate (chuck body) that is mainly made of insulating ceramics (for example, alumina), and a wafer is held on a surface of the ceramic substrate by an electrostatic attractive force. The electrostatic attractive force is generated as a voltage is applied to a chuck electrode that is provided in the ceramic substrate.

Regarding the electrostatic chuck of this type, in a plasma process such as plasma etching, heat is removed from the wafer by supplying helium gas between the ceramic substrate and the wafer. Therefore, in the ceramic substrate of the electrostatic chuck, a flow path (conduit) for allowing a heat-transferring gas, which is supplied from the outside, to flow toward the wafer is formed. The flow path extends from the back surface side of the ceramic substrate to the front surface side of the ceramic substrate on which the wafer is placed. Moreover, in the flow path, a porous region that includes a porous body of an insulating ceramic material (for example, alumina) is provided. The porous region is provided in order to suppress occurrence of abnormal electric discharge (passing of plasma to the flow path) in the plasma process while allowing passing of helium gas therethrough. In the porous body, a gas passage, through which helium gas passes, is formed in a mesh pattern. The gas passage is formed from pores that are traces where a particulate pore-forming material (synthetic resin beads, carbon powder, or the like) burned out (vanished) when the porous body was manufactured (fired). That is, the gas passage is formed as a plurality of pores are connected in a mesh pattern in the porous body.

CITATION LIST

Patent Literature

PTL 1: Japanese Patent No. 4959905

Technical Problem

In recent years, regarding the plasma process, increase of plasma power is demanded for reasons such as increase of etching speed. Therefore, high plasma resistance is required for the porous body in the flow path. However, there is a problem in that the insulating properties of the porous body may decrease, depending on a state in which the pores are arranged in the porous body.

SUMMARY OF INVENTION

An object of the present invention is to provide a holding device including a porous body that forms a porous region of a gas flow path and that has high plasma resistance.

Solution to Problem

Solution to the problem is as follows. That is,
<1> A holding device comprising a ceramic substrate including a plate-shaped member that includes a first surface for holding an object and contains ceramics as a main component and a gas flow path that is formed in the plate-shaped member, wherein the gas flow path includes, in a part thereof, a porous region that is a region in which a gas-permeable porous body that contains ceramics as a main component and includes a large number of pores is disposed, wherein the porous body includes, as the pores, a large number of large-diameter pores whose median particle diameter is greater than 20 µm and less than or equal to 55 µm and a large number of small-diameter pores whose median particle diameter is greater than or equal to 3 µm and less than or equal to 20 µm, and wherein a volume percent of the large-diameter pores included in the porous body is greater than a volume percent of the small-diameter pores included in the porous body.
<2> The holding device according to <1>, wherein a porosity of the porous body is greater than or equal to 60%.
<3> The holding device according to <1> or <2>, wherein the porous body does not include an excessively large space in which the pores are connected over a length of greater than or equal to 120 µm in one direction.

Advantageous Effects of Invention

With the present invention, it is possible to provide a holding device including a porous body that forms a porous region of a gas flow path and that has high plasma resistance.

DESCRIPTION OF EMBODIMENTS

First Embodiment

Hereafter, a holding device 100 according to a first embodiment will be described with reference to FIGS. 1 to 5. The holding device 100 is an electrostatic chuck that attracts and holds an object (for example, a wafer W) with an electrostatic attractive force, while heating the object to a predetermined processing temperature (in the range of, for example, 50° C. to 400° C.). The electrostatic chuck is used, for example, as a table on which the wafer F is placed in a process of etching the wafer F by using plasma in a depressurized chamber.

Figure 1:
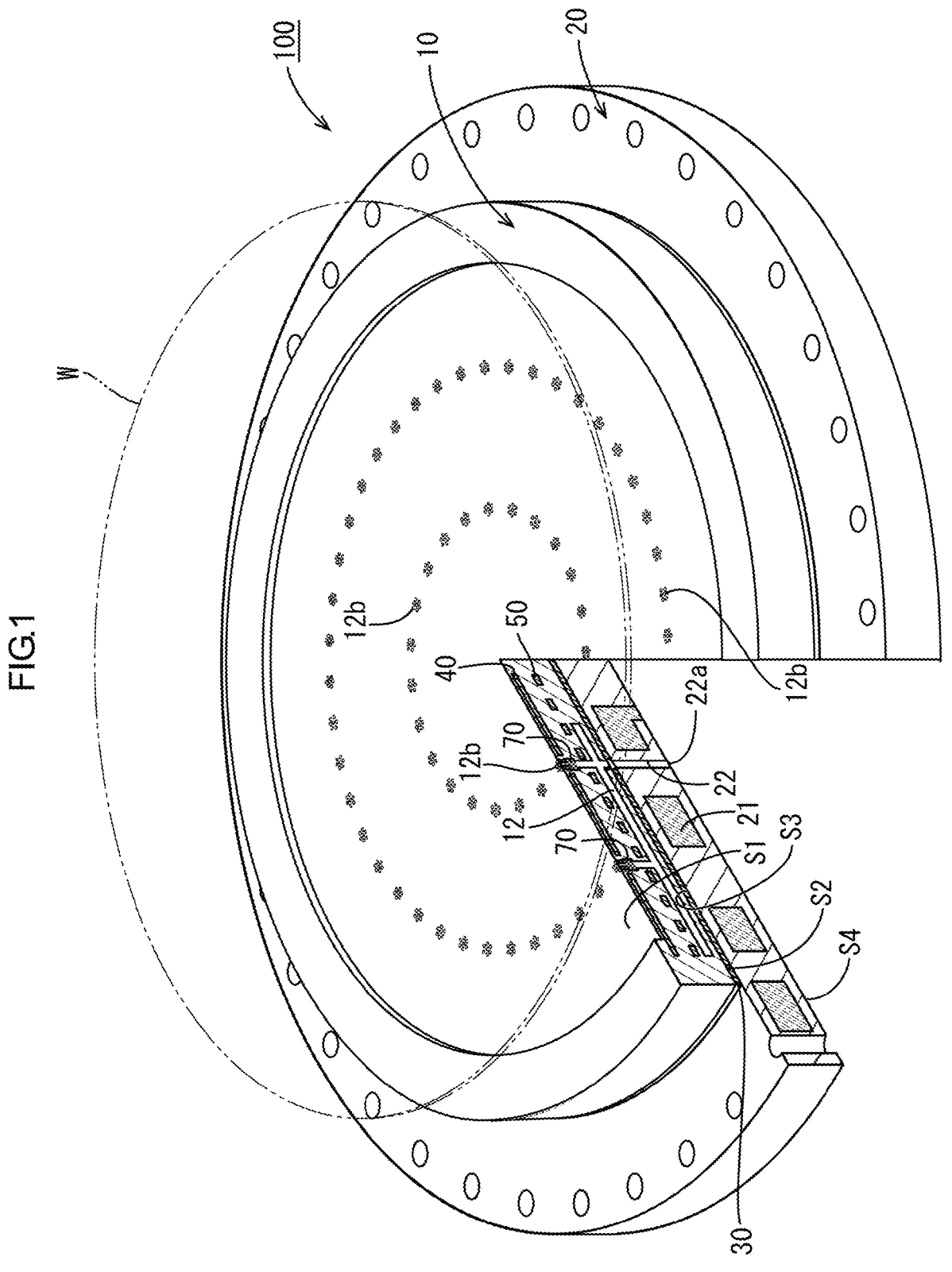
FIG. 1 is a schematic view illustrating the general configuration of a holding device according to a first embodiment.
Figure 2:
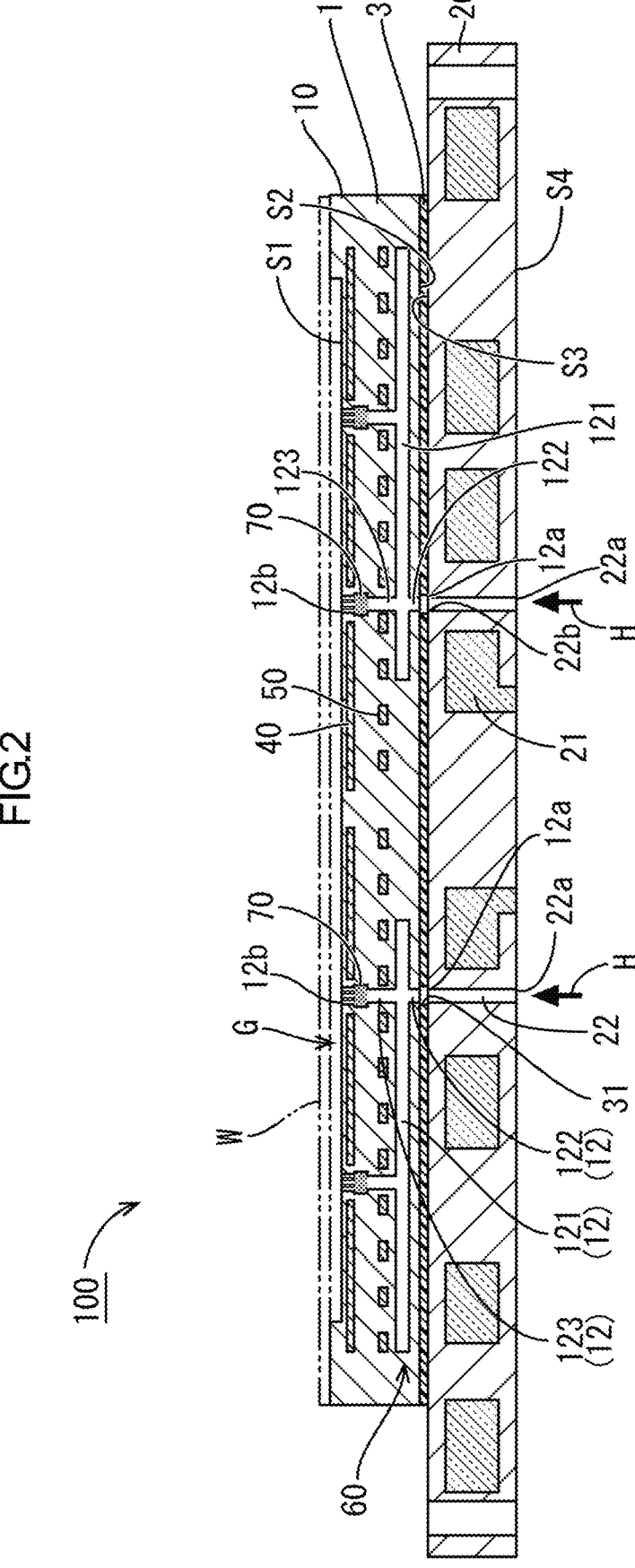
FIG. 2 is a schematic sectional view illustrating the internal structure of the holding device according to the first embodiment.

FIG. 1 is a schematic view illustrating the general configuration of the holding device 100 according to the first embodiment, and FIG. 2 is a schematic sectional view illustrating the internal structure of the holding device 100 according to the first embodiment. The holding device 100 includes a ceramic substrate 10 having a disk-like shape and a base member 20 having a disk-like shape larger than that of the ceramic substrate 10. For example, when the ceramic substrate 10 has a disk-like shape with a diameter of 300 mm and a thickness of 3 mm, the base member 20 is set to have a disk-like shape with a diameter of 340 mm and a thickness of 20 mm. The ceramic substrate 10 and the base member 20 each may have a positioning portion (a recess, a protrusion, or the like) for positioning these with each other.

The ceramic substrate 10 and the base member 20 are superposed on each other in the up-down direction in a state in which the ceramic substrate 10 is disposed on the upper side and the base member 20 is disposed on the lower side. The ceramic substrate 10 and the base member 20 are joined to each other by using a joining material 30 interposed therebetween.

The ceramic substrate 10 has: a first surface S1 that is disposed on the upper side and has a substantially-circular shape; and a second surface S2 that is disposed on a side opposite to the first surface S1 (that is, the lower side), faces the base member 20, and has a substantially-circular shape. The base member 20 has: a third surface S3 that is disposed on the upper side, faces the second surface S2 of the ceramic substrate 10, and has a substantially-circular shape; and a fourth surface S4 that is disposed on a side opposite to the third surface S3 (that is, the lower side) and has a substantially-circular shape. The aforementioned joining material 30 is in a state of being spread in a layer-like shape while being interposed between the second surface S2 of the ceramic substrate 10 and the third surface S3 of the base member 20.

The ceramic substrate 10 includes a plate-shaped member 11 having a disk-like shape and a substrate-side gas flow path 12 formed in the plate-shaped member 11. A surface on the upper side of the plate-shaped member 11 is the first surface S1 of the ceramic substrate 10. A surface on the lower side of the plate-shaped member 11 is the second surface S2 of the ceramic substrate 10.

The plate-shaped member 11 is an insulating member that contains ceramics as a main component and has a plate-like shape (disk-like shape). In the present description, a "main component" means a component having the highest content ratio. The plate-shaped member 11 of the present embodiment is formed from alumina ($Al_2O_3$). In another embodiment, the plate-shaped member 11 may be formed from other ceramics such as aluminum nitride (AlN).

The substrate-side gas flow path (an example of a gas flow path) 12 is a part of a flow path 60 that is included in the holding device 100 and that allows an inert gas (for example, helium gas that is a heat-transferring fluid) to flow. The substrate-side gas flow path 12 is formed in the plate-shaped member 11 of the ceramic substrate 10. The substrate-side gas flow path 12 includes an inlet 12a that opens in the second surface S2 of the ceramic substrate 10 and an outlet 12b that opens in the first surface S1. As a whole, the substrate-side gas flow path 12 is provided in such a way as to extend through the inside of the plate-shaped member 11 from the inlet 12a toward the outlet 12b. Therefore, when the inert gas is supplied from the inlet 12a, the inert gas passes through the substrate-side gas flow path 12 and finally is discharged to the outside from the outlet 12b. The substrate-side gas flow path 12 includes a horizontal flow path 121, a first vertical flow path 122, and a second vertical flow path 123.

The horizontal flow path 121 is a flow path that extends in the plate-shaped member 11 in a direction perpendicular to the thickness direction of the plate-shaped member 11 (that is, a direction along the first surface S1 and the like, the left-right direction in FIG. 2).

The first vertical flow path 122 is a flow path that connects the inlet 12a and the horizontal flow path 121 in the plate-shaped member 11 while extending in the thickness direction of the plate-shaped member 11.

The second vertical flow path 123 is a flow path that connects the outlet 12b and the horizontal flow path 121 in the plate-shaped member 11 while extending in the thickness direction of the plate-shaped member 11. In the present embodiment, a plurality of second vertical flow paths 123 are connected to one horizontal flow path 121. The second vertical flow path 123 includes, as described below, an accommodation chamber 123a in which a porous body is accommodated and a discharge path 123b that includes the outlet 12b while being connected to the accommodation chamber 123a.

The ceramic substrate 10 further includes a chuck electrode 40 and a heater electrode 50.

The chuck electrode 40 is formed from an electroconductive material (for example, tungsten, molybdenum, platina, or the like) in a layer-like shape (planar shape). As illustrated in FIG. 2, the chuck electrode 40 is disposed on the first surface S1 side in the ceramic substrate 10 (the plate-shaped member 11). When seen from the up-down direction, the chuck electrode 40 has a substantially-circular shape as a whole. When a direct-current high voltage is applied from a power source (not shown), an electrostatic attractive force is generated from the chuck electrode 40, and the wafer W is attracted and fixed to the first surface S1 of the ceramic substrate 10 by the electrostatic attractive force. To the chuck electrode 40, a known power-supply terminal (not shown) is electrically connected.

When a voltage is applied and a current flows through the heater electrode 50, the heater electrode 50 generates heat to heat the wafer W held on the first surface S1 of the ceramic substrate 10. As illustrated in FIG. 2, the heater electrode 50 is disposed in the ceramic substrate 10 (the plate-shaped member 11) on the lower side (that is, the second surface S2 side) than the chuck electrode 40. The heater electrode 50 includes a plurality of heater electrodes, and forms a concentrically-circular pattern or a spiral pattern as a whole when seen from the up-down direction. The heater electrode 50 is formed from an electroconductive material (aluminum, nickel, copper, stainless steel, or the like) in a layer-like shape (planar shape). To each heater electrode 50, a known power-supply terminal (not shown) is electrically connected. By appropriately adjusting a current supplied to each heater electrode 50, it is possible to control the temperature of the semiconductor wafer W held on the first surface S1. The ceramic substrate 10 may further include a temperature-measuring element (for example, a thermistor) or the like.

As illustrated in FIGS. 1 and 2, a plurality of outlets 12b are provided in the first surface S1 of the ceramic substrate 10. An outer peripheral edge portion of the first surface S1 is formed in an annular shape while protruding slightly upward compared with a portion inside thereof. Therefore, as illustrated in FIG. 2, when the wafer W is attracted and held on the first surface S1, a clearance (gap) G is formed between the semiconductor wafer W and an inside portion of the first surface S1.

The base member 20 contains, for example, a metal (aluminum, an aluminum alloy, or the like), a composite of a metal and ceramics (Al-SiC), or ceramics (SiC), as a main component.

A coolant flow path 21 is provided in the base member 20. Water-cooling of plasma heat is performed by causing a coolant (for example, fluorinated inert liquid, water, or the like) to flow through the coolant flow path 21. When the coolant flows through the coolant flow path 21, the base member 20 is cooled, and the ceramic substrate 10 is cooled due to heat transfer (heat removal) between the base member 20 and the ceramic substrate 10 via the joining material 30. As a result, the wafer W held on the first surface S1 of the ceramic substrate 10 is cooled. By appropriately adjusting the flow rate of the coolant in the coolant flow path 21, it is possible to control the temperature of the semiconductor wafer W held on the first surface S1.

A base-side gas flow path 22, which is a part of the flow path 60, is provided in the base member 20. The base-side gas flow path 22 as a whole is shaped like a through-hole extending in the thickness direction of the base member 20, and includes an inlet 20a that opens in the fourth surface S4 of the base member 20 and an outlet 20b that opens in the third surface S3. The inlet 20a is an inlet of the base-side gas flow path 22 and is an inlet of the entirety of the flow path 60 provided in the holding device 100.

The joining material 30 is made of, for example, a silicone-based organic sealant, an inorganic sealant, a bonding sheet including an Al-based metal adhesive, or the like. Preferably, the joining material 30 is a material that has high heat resistance and heat conductivity while having high adhesion to both of the ceramic substrate 10 and the base member 20.

Also in the joining material 30, a joining-side gas flow path 31, which is a part of the flow path 60, is formed. The joining-side gas flow path 31 is a hole that extends through the joining material 30, having a layer-like shape, in the thickness direction.

The flow path 60 supplies an inert gas (helium gas or the like) to the first surface S1 side of the holding device 100. A large number of outlets 12b of the flow path 60 are provided in the first surface S1, and the inert gas is supplied to the first surface S1 side in such a way that the inert gas is discharged from the outlets 12b. As described above, the flow path 60 includes the base-side gas flow path 22, the joining-side gas flow path 31, and the substrate-side gas flow path 12.

A plurality of inlets 22a of the flow path 60 are provided in the fourth surface S4 of the base member 20. When an inert gas (arrows H in FIG. 2) is supplied from each inlet 22a, the inert gas successively passes through the base-side gas flow path 22 connected to each inlet 22a, the joining-side gas flow path 31, and the substrate-side gas flow path 12; and, finally, the inert gas is discharged from the plurality of outlets 12b provided in the first surface S1.

An outlet 22b of the base-side gas flow path 22 is connected to an opening of the joining-side gas flow path 31 on the lower side (the base member 20 side). An opening of the joining-side gas flow path 31 on the upper side (the ceramic substrate 10 side) is connected to the inlet 12a of the substrate-side gas flow path 12. A plurality of inlets 12a of the substrate-side gas flow path 12 are provided in the second surface S2 of the ceramic substrate 10.

The first vertical flow path 122, which has the inlet 12a of the substrate-side gas flow path 12 on the upstream side, is connected to the horizontal flow path 121 on the downstream side thereof. To the horizontal flow path 121, a plurality of second vertical flow paths 123 are connected. That is, the substrate-side gas flow path 12 has a shape that branches into a plurality of paths from the upstream side toward the downstream side in the ceramic substrate 10 (the plate-shaped member 11).

Figure 3:
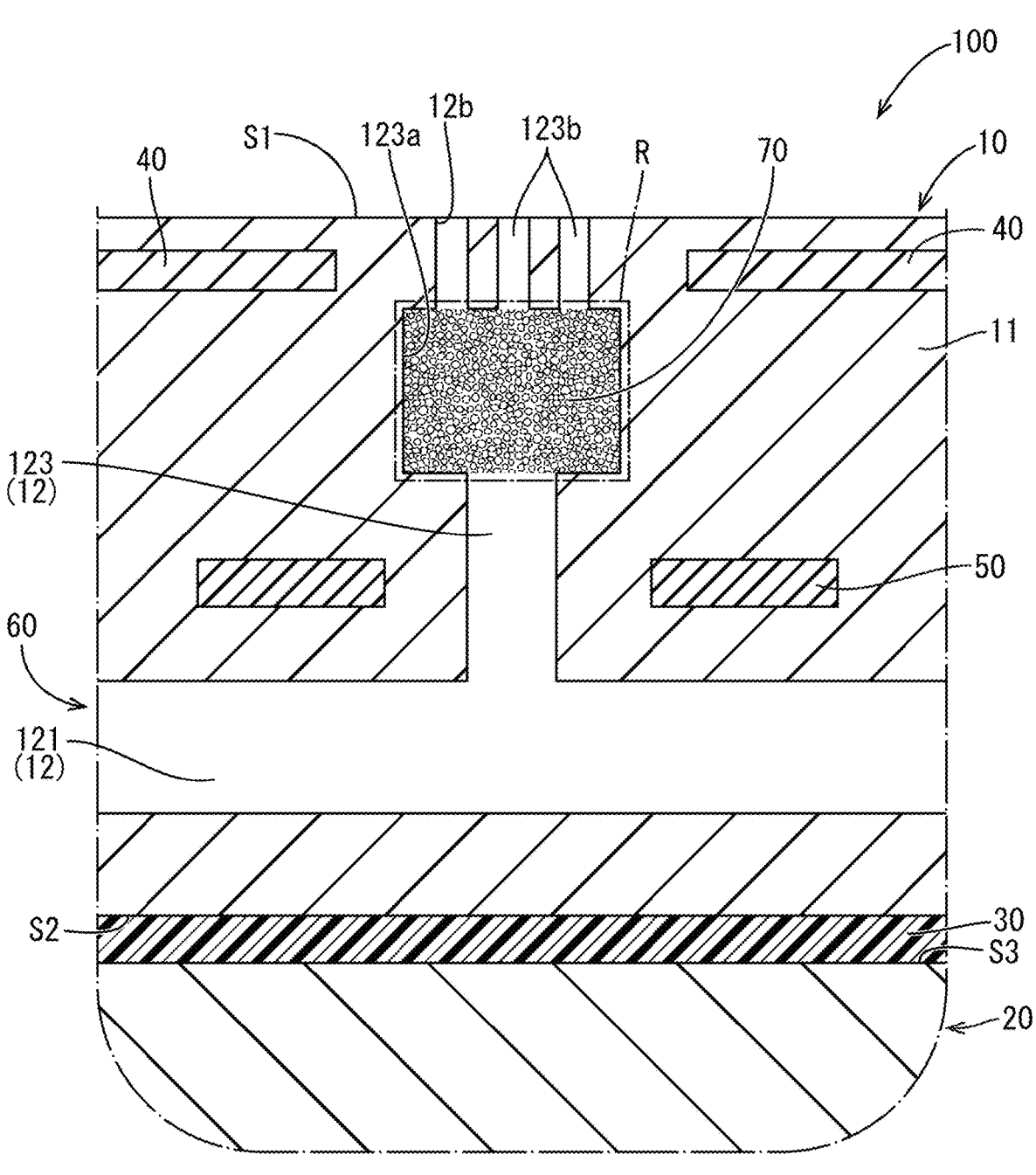
FIG. 3 is an enlarged sectional view illustrating a part of a substrate-side gas flow path of the holding device.

FIG. 3 is an enlarged sectional view illustrating a part of the substrate-side gas flow path 12 of the holding device 100. As illustrated in FIG. 3, the second vertical flow path 123 of the substrate-side gas flow path 12 includes the accommodation chamber 123a and the discharge path 123b.

The accommodation chamber 123a is a part of the second vertical flow path 123, and has an inside diameter greater than that of the second vertical flow path 123 located on the upstream side thereof. The accommodation chamber 123a is formed in the plate-shaped member 11 of the ceramic substrate 10. That is, the accommodation chamber 123a is formed from alumina (ceramics) included in the plate-shaped member 11. The accommodation chamber 123a includes therein a substantially-cylindrical space. A porous body 70 is disposed in the space (that is, in the accommodation chamber 123a) without clearance. A region of the substrate-side gas flow path 12 in which the porous body 70 is disposed in the accommodation chamber 123a of the second vertical flow path 123 will be referred to a "porous region R".

The discharge path 123b is a flow path that is connected to the downstream side of the accommodation chamber 123a, and is shaped like a through-hole extending in the thickness direction of the ceramic substrate 10 (the plate-shaped member 11). A plurality of discharge paths 123b are connected to one accommodation chamber 123a. Each discharge path 123b has a thinner diameter (smaller diameter) than the accommodation chamber 123a and the second vertical flow path 123 located on the upstream side thereof. An open end of each discharge path 123b on the downstream side is the outlet 12b of the flow path 60. Since the porous region R is formed on the first surface S1 side, when the first surface S1 is seen in plan view, the porous body 70 is in a state of being exposed from each outlet 12b.

Figure 4:
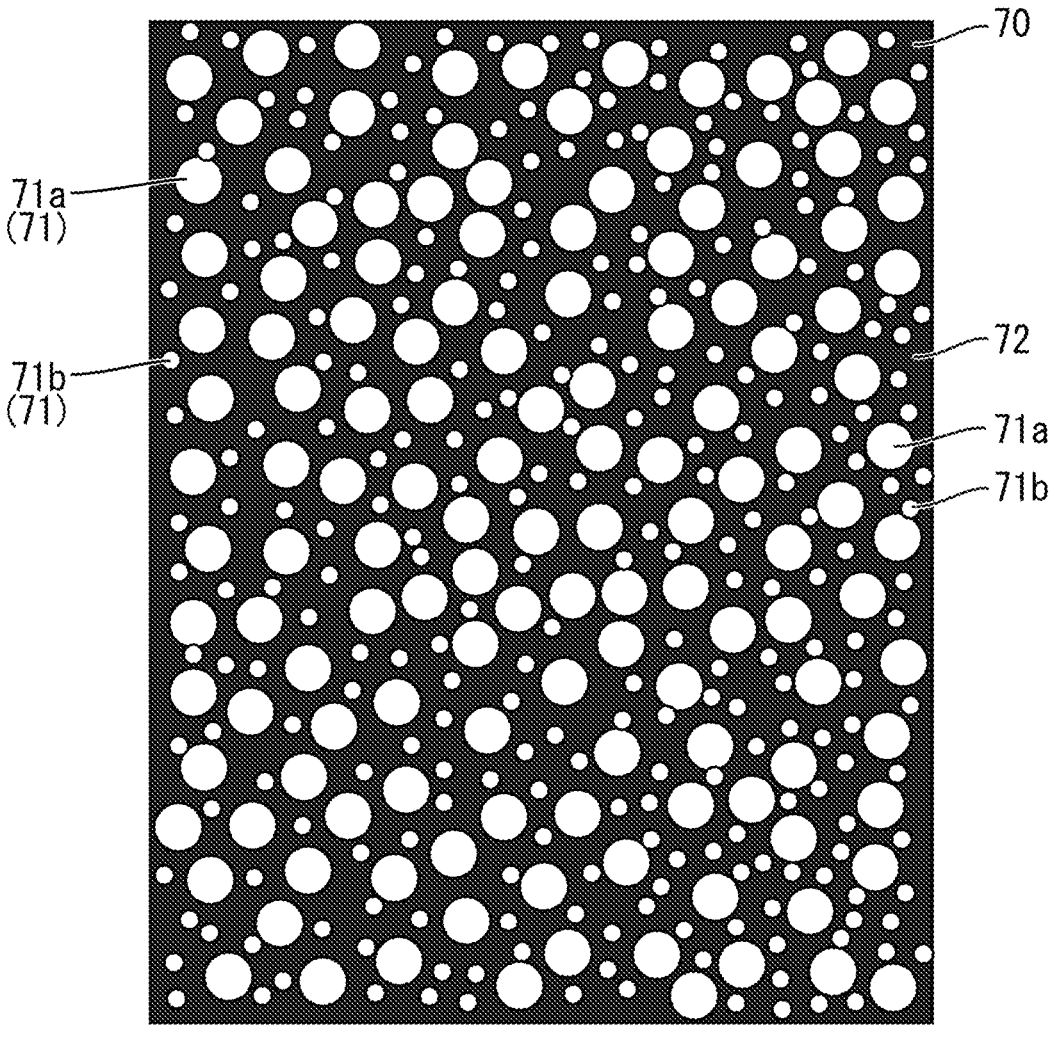
FIG. 4 is a schematic view illustrating a part of the internal structure of a porous body.

The porous body 70 is a gas-permeable member that contains ceramics as a main component and includes a large number of pores 71. FIG. 4 is a schematic view illustrating a part of the internal structure of the porous body 70. The porous body 70 has a solid-cylindrical shape as a whole, and a gas passage, through which an inert gas passes, is formed therein in a mesh pattern. The gas passage is formed from a large number of pores 71 that are connected to each other in the porous body 70. The pores 71 are formed as traces where a particulate pore-forming material burned out (vanished) when the porous body 70 was manufactured (fired). In the present description, a skeletal part of the porous body 70 other than the pores 71 will be referred to as a "filler 72".

In the present embodiment, the porous body 70 contains alumina ($Al_2O_3$) as a main component, as with the plate-shaped member 11 of the ceramic substrate 10. In another embodiment, the porous body 70 may contain other ceramics such as aluminum nitride (AlN) as a main component.

The porous body 70 includes, as the pores 71, a large number of large-diameter pores 71a whose median particle diameter is greater than 20 μm and less than or equal to 55 μm and a large number of small-diameter pores 71b whose median particle diameter is greater than or equal to 3 μm and less than or equal to 20 μm. Preferably, the median particle diameter of the large-diameter pores 71a is greater than or equal to 25 μm and less than or equal to 55 μm. Preferably, the median particle diameter of the small-diameter pores 71*b* is greater than or equal to 10 μm and less than or equal to 20 μm.

In the present description, the median particle diameter of the pores 71 is calculated as the quotient of "the median particle diameter of the pore-forming material" divided by a shrinkage ratio. The shrinkage ratio is the ratio at which a ceramic compact (a green compact described below) for manufacturing the porous body 70 shrinks when fired. The median particle diameter of the pore-forming material is a particle diameter such that the cumulative value of a particle-size distribution that is measured by using a light scattering method becomes 50 volume %.

As the pore-forming material, for example, synthetic resin beads, carbon powder, or the like is used. A particulate pore-forming material may have, for example, a spherical (perfectly spherical) shape or a polygonal shape. The median particle diameter of a pore-forming material is calculated on the assumption that the pore-forming material has a perfectly spherical shape.

In the present embodiment, the volume percent of the large-diameter pores 71*a* included in the porous body 70 is set to be greater than the volume percent of the small-diameter pores 71*b* included in the porous body 70. With such a setting, when the holding device 100 is used (for example, in a plasma process when plasma etching is performed on an object in a state in which the object is held), the insulating properties of the porous region R are ensured while the gas permeability in the porous region R of the substrate-side gas flow path (gas flow path) 12 is ensured.

The volume percent of the large-diameter pores 71*a* included in the porous body 70 is preferably greater than or equal to 60 volume % and less than or equal to 90 volume % and more preferably greater than or equal to 65 volume % and less than or equal to 80 volume %. The volume percent of the large-diameter pores 71*a* included in the porous body 70 can be set to a desirable value by appropriately adjusting the use amount of the pore-forming material for forming the large-diameter pores 71*a* or the like when manufacturing the porous body 70.

The volume percent of the small-diameter pores 71*b* included in the porous body 70 is preferably greater than or equal to 10 volume % and less than or equal to 40 volume % and more preferably greater than or equal to 20 volume % and less than or equal to 35 volume %. The volume percent of the small-diameter pores 71*b* included in the porous body 70 can be set to a desirable value by appropriately adjusting the use amount of the pore-forming material for forming the small-diameter pores 71*b* or the like when manufacturing the porous body 70.

When each volume percent of the large-diameter pores 71*a* and the small-diameter pores 71*b* included in the porous body 70 is in the aforementioned range, a small-diameter pore 71*b* does not easily enter a space between adjacent large-diameter pores 71*a* in the porous body 70, and, as a result, a plurality of large-diameter pores 71*a* are suppressed from becoming excessively connected linearly in one direction. If the volume percent of the large-diameter pores 71*a* included in the porous body 70 is too large, the probability that a plurality of large-diameter pores 71*a* become continuously adjacent to each other linearly in the porous body 70 increases. Moreover, if the volume percent of the small-diameter pores 71*b* included in the porous body 70 is too large, a sufficient gas passage is not formed in the porous body 70 and the gas permeability decreases.

The "volume percent of the large-diameter pores 71*a* included in the porous body 70" is the ratio of the volume of all large-diameter pores 71*a* to the volume of all pores of the porous body 70 (100%). The "volume percent of the small-diameter pores 71*b* included in the porous body 70" is the ratio of the volume of all small-diameter pores 71*b* to the volume of all pores of the porous body 70 (100%). The volume of all pores of the porous body 70 is calculated from the porosity of the porous body 70 and the volume of the porous body 70.

In the present embodiment, the porosity of the porous body 70 is not particularly limited, but preferably, for example, is greater than or equal to 60% as long as the object of the present invention is not impaired. The porosity of the porous body 70 is obtained by using the Archimedes method. If the porosity of the porous body 70 is in such a range, when the holding device 100 is used (when a plasma process is performed), the insulating properties of the porous region R are ensured while gas permeability in the porous region R of the substrate-side gas flow path (gas flow path) 12 is ensured.

In the present embodiment, it is preferable that the porous body 70 does not include therein an excessively large space in which the pores 71 are connected over a length of greater than or equal to 120 μm in one direction. Here, "one direction" is a direction that is defined in any appropriate way in the porous body 70. When the porous body 70 does not include such an excessively large space, the insulating properties of the porous body 70 are increased, and, as a result, dielectric breakdown of the porous body 70 due to the excessively large space when the holding device 100 is used (in a plasma process) is suppressed.

Preferably, the one direction is a direction that is substantially perpendicular to the first surface S1 of the holding device 100 (that is, the thickness direction of the holding device 100). When the porous body 70 is set so that the porous body 70 does not include an excessively large space in which the pores 71 are connected over a length of greater than or equal to 120 μm in the direction substantially perpendicular to the first surface S1 of the holding device 100 (one direction), dielectric breakdown of the porous body 70 when the holding device 100 is used (in a plasma process) is more effectively suppressed.

Figure 5:
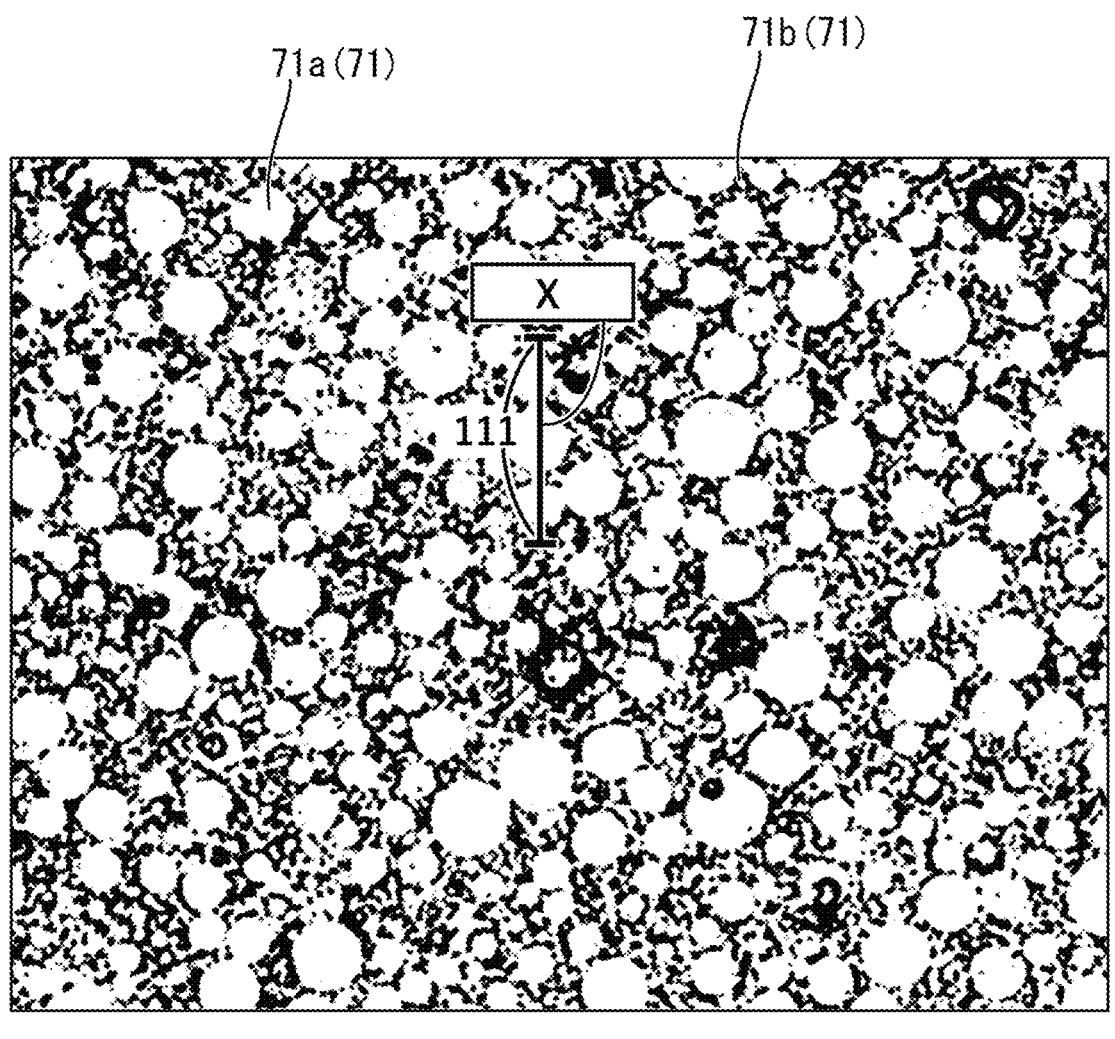
FIG. 5 is a digitized image of a cross section of the porous body.

Here, referring to FIG. 5, a method of examining whether an excessively large space is present or absent in the porous body 70 will be described. FIG. 5 is a digitized image of a cross section of the porous body 70. First, the porous body 70 is cut in any appropriate direction, and an image of the obtained cross section is captured by using a scanning electron microscope (SEM) (magnification: 200 times). The obtained SEM image is digitized by using commercially-available material development simulation software, and, from the obtained digitized image, extraction of an excessively large space in which the pores 71 are connected over a length of greater than or equal to 120 μm in one direction is performed. The digitized image illustrated in FIG. 5 does not include an excessively large space, and, at the largest, only a space X having a length of 111 μm in one direction (the up-down direction in FIG. 5) is found. The digitized image illustrated in FIG. 5 corresponds to a SEM image of a cross section that is obtained by cutting the porous body 70 of the holding device 100 in a direction substantially perpendicular to the first surface S1. The up-down direction in FIG. 5 corresponds to the direction substantially perpendicular to the first surface S1.

In the present embodiment, a gas passage is formed in the porous body 70 in such a way that a space extending over a large length in a specific direction (excessively large space)

is not formed while the large-diameter pores 71a and the small-diameter pores 71b are combined with each other.

Here, a method of manufacturing the holding device 100 according to the present embodiment will be described. The method of manufacturing the holding device 100 is, for example, as follows. First, the ceramic substrate 10 and the base member 20 are produced.

A method of producing the ceramic substrate 10 is, for example, as follows. First, an organic solvent is added to a mixture of alumina powder, an acrylic binder, and an appropriate amount of disperser and plasticizer, and these are mixed in a ball mill to produce slurry for green sheet. The slurry for green sheet is molded into a sheet-like shape by using a casting device, and, subsequently, the obtained compact is dried to produce a plurality of green sheets.

An electroconductive powder of tungsten, molybdenum, or the like is added to a mixture of alumina powder, an acrylic binder, and an organic solvent, and these are kneaded to produce a metallized paste. By printing the metallized paste by using, for example, a screen-printing device, a green conductor layer to become a heater electrode, a chuck electrode, or the like is formed on each specific green sheet.

Moreover, holes and grooves to become the substrate-side gas flow path 12 and the like are formed in each specific green sheet. At this time, a hole for forming the accommodation chamber 123a is formed in the specific green sheet.

A mixture of alumina powder, a pore-forming material, and a binder is molded to obtain a green compact for the porous body 70, having a predetermined size. As the pore-forming material, synthetic resin beads, carbon powder, or the like is used. The particle diameter of alumina powder (ceramic powder) is appropriately adjusted. The hole for forming the accommodation chamber 123a, which is provided in the specific green sheet, is filled with the green compact. At this time, the green compact for the porous body 70 may be attached to the hole of the green sheet by using an adhesive or the like.

Next, a plurality of (for example, twenty) aforementioned green sheets are thermocompression bonded, and, as necessary, an outer periphery thereof is cut off to produce a green sheet stack. The green sheet stack is cut by machining to produce a compact having a disk-like shape, the compact is degreased, and further the degreased compact is fired to produce a fired compact. When this compact is fired, the aforementioned green compact for the porous body 70 is also fired to become the porous body 70. The pore-forming material in the green compact burns out (vanishes) when fired, and thereby a gas passage that is three-dimensionally connected in a mesh pattern is formed in the porous body 70.

Next, a mask that covers a portion corresponding to the protruding outer peripheral edge portion is placed on the surface of the obtained fired compact, and, for example, by performing shot blasting of projecting particles of ceramics or the like, a protruding outer peripheral edge portion is formed on the surface of the fired compact. Subsequently, by polishing the surface of the fired compact, the ceramic substrate 10 is obtained.

A method of producing the base member 20 is basically the same as that of producing an existing base member. Therefore, detailed description thereof will be omitted.

After the ceramic substrate 10 and the base member 20 have been produced, these are joined by using the joining material 30. Joining of the ceramic substrate 10 and the base member 20 using the joining material 30 is basically the same as joining in exiting products. Therefore, detailed description thereof will be omitted. In this way, the holding device 100 is manufactured.

As heretofore described, in the holding device 100 according to the present embodiment, the volume percent of the large-diameter pores 71a included in the porous body 70 is set to be greater than the volume percent of the small-diameter pores 71b included in the porous body 70. With such a setting, when the holding device 100 is used (for example, in a plasma process when plasma etching of an object is performed in a state in which the object is held), the insulating properties of the porous region R are ensured while the gas permeability in the porous region R of the substrate-side gas flow path (gas flow path) 12 is ensured. The holding device 100 includes the porous body 70 that constitutes the porous region R of the substrate-side gas flow path (gas flow path) 12 and that has high plasma resistance.

In the present embodiment, if the porosity of the porous body 70 is greater than or equal to 60%, when the holding device 100 is used (in a plasma process), the insulating properties of the porous region R are ensured while gas permeability in the porous region R of the substrate-side gas flow path (gas flow path) 12 is ensured.

In the present embodiment, preferably, the porous body 70 does not include therein an excessively large space in which the pores 71 are connected over a length of greater than or equal to 120 µm in one direction. When the porous body 70 does not include such an excessively large space, the insulating properties of the porous body 70 are increased, and, as a result, dielectric breakdown of the porous body 70 due to the excessively large space when the holding device 100 is used (in a plasma process) is suppressed.

Second Embodiment

Figure 6:
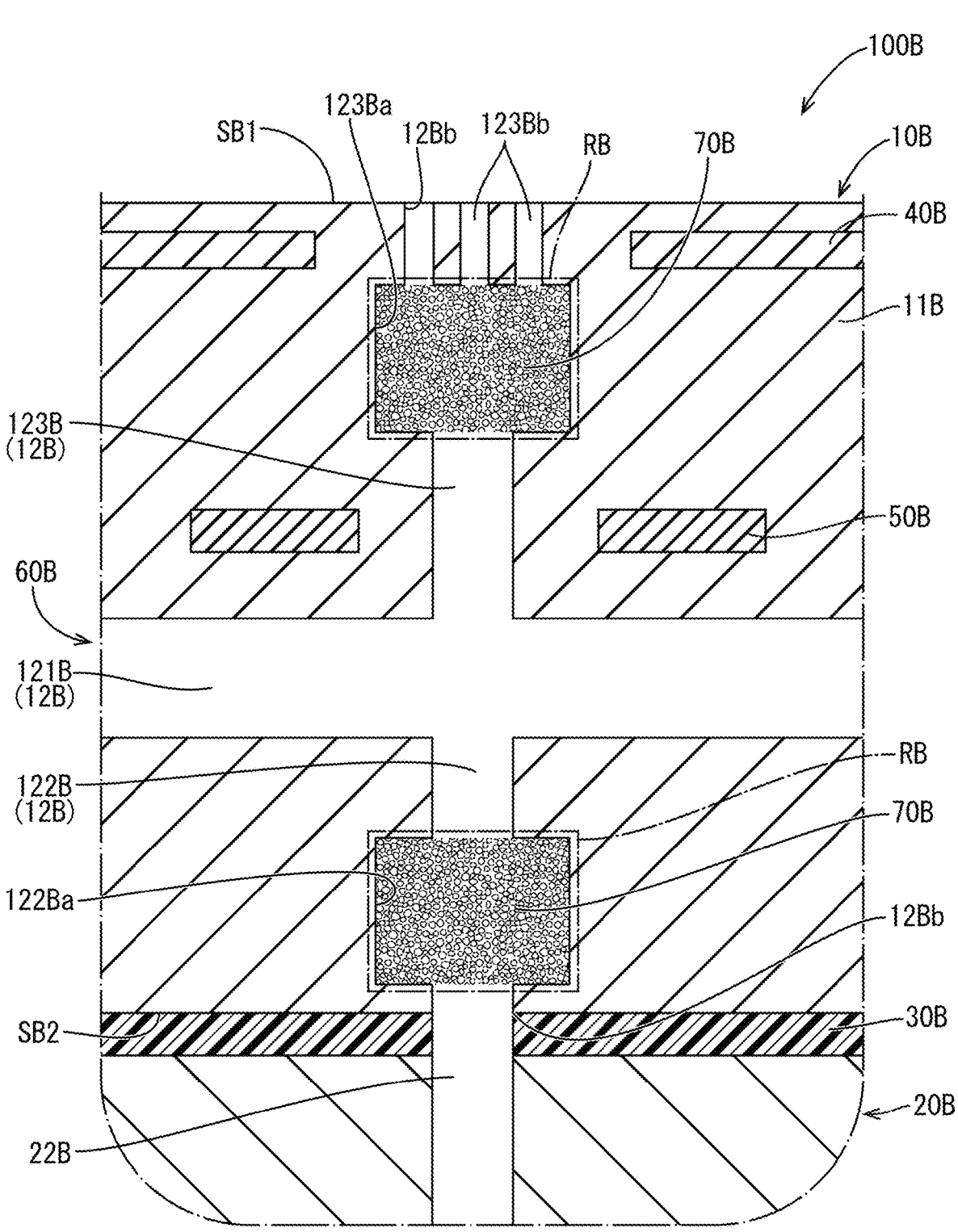
FIG. 6 is an enlarged sectional view illustrating a part of a substrate-side gas flow path of a holding device according to a second embodiment.

Next, a holding device 100B according to a second embodiment will be described with reference to FIG. 6. FIG. 6 is an enlarged sectional view illustrating a part of a substrate-side gas flow path 12B of the holding device 100B according to the second embodiment. The basic configuration of the holding device 100B according to the present embodiment is the same as that according the first embodiment. Therefore, elements in FIG. 6 corresponding to those in the first embodiment are denoted by numerals with "B" added to those in the first embodiment, and detailed descriptions thereof will be omitted.

As with the first embodiment, the holding device 100B according to the present embodiment includes a ceramic substrate 10B having a disk-like shape, a base member 20B having a disk-like shape, and a layer-shaped joining material 30B interposed therebetween. The ceramic substrate 10B includes a plate-shaped member 11B, a substrate-side gas flow path 12B formed therein, a chuck electrode 40B, and a heater electrode 50B.

The substrate-side gas flow path 12B is a part of a flow path 60B through which an inert gas (helium gas) passes, and FIG. 6 illustrates a horizontal flow path 121B, a first vertical flow path 122B, and a second vertical flow path 123B.

In the second vertical flow path 123AB, an accommodation chamber 123Ba in which a porous body 70B is accommodated and a discharge path 123Bb that is connected to the accommodation chamber 123Ba and includes an outlet 12Bb are provided. The outlet 12Bb is disposed on a first surface SAB of the ceramic substrate 10B. A region in which the porous body 70B is disposed in the accommodation chamber 123Ba is a porous region RB.

In the present embodiment, the porous region RB is provided also in the first vertical flow path 122B. The porous region RB is provided near an inlet 12Ba that opens in a second surface SB2. An accommodation chamber 122Ba in which the porous body 70B is accommodated is provided in the first vertical flow path 122B, and a region in which the porous body 70B is disposed in the accommodation chamber 122Ba is the porous region RB in the first vertical flow path 122B.

The porous body 70B of the present embodiment is the same as that of the first embodiment. Therefore, also in the present embodiment, the volume percent of the large-diameter pores included in the porous body 70B is set to be greater than the volume percent of the small-diameter pores included in the porous body 70B. The porosity of the porous body 70B is set to be greater than or equal to 60%.

In the present embodiment, the porous body 70B is set so that the porous body 70B does not include therein an excessively large space in which the pores are connected over a length of greater than or equal to 120 μm.

As described above, in the holding device 100B according to the present embodiment, the porous region RB for increasing plasma resistance may be provided in a part of the substrate-side gas flow path 12B disposed near the second surface SB2 side.

The holding device 100B according to the present embodiment includes, as with the first embodiment, the porous body 70B that constitutes the porous region RB of the substrate-side gas flow path (gas flow path) 12B and that has high plasma resistance.

Other Embodiments

The present invention is not limited to the embodiments described in the above description and drawings, and, for example, the following embodiments are also included in the technical scope of the present invention.

(1) In the embodiments described above, the ceramics of the porous body and the ceramics of the plate-shaped member of the ceramic substrate are ceramics of the same type. However, as long as the object of the present invention is not impaired, for example, the ceramics of the porous body and the ceramics of the plate-shaped member may be ceramics of different types. For example, the porous body may be made of alumina and the plate-shaped member may be made of aluminum nitride, or the porous body may be made of aluminum nitride and the plate-shaped member may be made of alumina.

(2) In the embodiments described above, a flow path for allowing an inert gas to pass is formed also in the base member. However, in another embodiment, the flow path need not be formed in the base member, and may be formed only in the ceramic substrate.

(3) The method of manufacturing a holding device described in the embodiment is an example, and, as long as the object of the present invention is not impaired, the holding device may be manufactured by using another method.

Hereafter, the present invention will be described based on Examples. It should be noted that the present invention is not limited to these Examples at all.

EXAMPLE 1

A ceramic substrate of Example 1 was produced by using the same method as in the first embodiment described above, except that a green compact for a porous body was formed under the following conditions.

Alumina powder, a pore-forming material, and a binder were mixed and the mixture was molded by using a predetermined molding device to obtain a green compact for a porous body having a solid-cylindrical shape. The pore-forming material was composed of a pore-forming material (average particle diameter 40 μm) for the large-diameter pores and a pore-forming material (average particle diameter 5 μm) for the small-diameter pores. The pore-forming material for the large-diameter pores was mixed by 280 parts by volume with respect to 100 parts by volume of alumina powder. The pore-forming material for the small-diameter pores was mixed by 120 parts by volume with respect to 100 parts by volume of alumina powder. As with the first embodiment described above, a hole, for forming the accommodation chamber, in a green sheet was filled with the obtained green compact for the porous body.

EXAMPLE 2

A ceramic substrate of Example 2 was produced in the same way as in Example 1, except that: a pore-forming material for the large-diameter pores (average particle diameter 27 μm) and a pore-forming material for the small-diameter pores (average particle diameter 20 μm) were used as pore-forming materials; and the mixture amount of the pore-forming material for the large-diameter pores was 280 parts by volume, and the mixture amount of the pore-forming material for the small-diameter pores was 120 parts by volume.

EXAMPLE 3

A ceramic substrate of Example 3 was produced in the same way as in Example 1, except that: a pore-forming material for the large-diameter pores (average particle diameter 240 μm) and a pore-forming material for the small-diameter pores (average particle diameter 20 μm) were used as pore-forming materials; and the mixture amount of the pore-forming material for the large-diameter pores was 280 parts by volume, and the mixture amount of the pore-forming material for the small-diameter pores was 120 parts by volume.

[Measurement of Permeability]

The permeability (gas permeability) of the porous body included in the ceramic substrate of each of Examples 1 to 3 was measured by using the following method.

The green compact for a porous body was formed, by injection-molding, in a hole formed on a green sheet and having a diameter of approximately 3.5 mm and a depth of approximately 5 mm, cut into a predetermined holder size, and then degreased and fired to obtain a sample. Subsequently, the sample was set in a He-gas-introducing unit, and the permeability of He gas under a pressure of 50 Torr was measured.

As a result of the measurement, the permeability in Example 1 was 3.9 sccm, the permeability in Example 2 was 10.1 sccm (the permeability increased by 159% relative to Example 1), and the permeability in Example 3 was 8.1 sccm (the permeability increased by 109% relative to Example 1).

[Measurement of Porosity]

The porosity of the porous body of each of Examples 1 to 3 was measured. To be specific, by using commercially-available material development simulation software, the porosity was measured based on a SEM image (digitized image) of a cross section that was obtained by cutting the porous body of each Example in the up-down direction. As a result, the porosity of the porous body of Example 1 was 72%, the porosity of the porous body of Example 2 was 70%, and the porosity of the porous body of Example 3 was 71%.

[Volume Percent of Pores]

Regarding the porous body of each of Examples 1 to 3, "the volume percent of the large-diameter pores included in the porous body", and "the volume percent of the small-diameter pores included in the porous body" were as follows.

In Example 1, the volume percent of the large-diameter pores was 44 volume %, and the volume percent of the small-diameter pores was 19 volume %.

In Example 2, the volume percent of the large-diameter pores was 39 volume %, and the volume percent of the small-diameter pores was 16 volume %.

In Example 3, the volume percent of the large-diameter pores was 45 volume %, and the volume percent of the small-diameter pores was 19 volume %.

[Examination of Presence or Absence of Excessively Large Space]

Whether an excessively large space was present or absent in the porous body of each of Examples 1 to 3 was examined by using a method that used the aforementioned SEM image. Here, extraction of an excessively large space was performed based on a SEM image (digitized image) of a cross section obtained by cutting the porous body of each Example in the up-down direction. As a result, in Examples 1 to 3, an excessively large space in which pores were connected over a length of greater than or equal to 120 μm in one direction was not detected.

REFERENCE SIGNS LIST

100 holding device, 10 ceramic substrate, 11 plate-shaped member, 12 substrate-side gas flow path (gas flow path), 12a inlet, 12b outlet, 121 horizontal flow path, 122 first vertical flow path, 123 second vertical flow path, 20 base member,

21 coolant flow path, 22 base-side gas flow path, 22a inlet, 22b outlet, 30 joining material, 31 joining-side gas flow path, 40 chuck electrode, 50 heater electrode, 60 flow path, 70 porous body, 71 pores, 71a large-diameter pore, 71b small-diameter pore, 72 filler, G gap, W object (wafer), R porous region, S1 first surface, S2 second surface, S3 third surface, S4 fourth surface

What is claimed is:

1. A holding device comprising a ceramic substrate including a plate-shaped member that includes a first surface for holding an object and contains ceramics as a main component and a gas flow path that is formed in the plate-shaped member, wherein the gas flow path includes, in a part thereof, a porous region that is a region in which a gas-permeable porous body that contains ceramics as a main component and includes a large number of pores is disposed, wherein the porous body includes, as the pores, a large number of large-diameter pores whose pore diameter is greater than 20 μm and less than or equal to 55 μm and a large number of small-diameter pores whose pore diameter is greater than or equal to 3 μm and less than or equal to 20 μm, and wherein a volume percent of the large-diameter pores included in the porous body is greater than or equal to 60 volume % and less than or equal to 90 volume %, and a volume percent of the small-diameter pores included in the porous body is greater than or equal to 10 volume % and less than or equal to 40 volume %.

2. The holding device according to claim 1, wherein a porosity of the porous body is greater than or equal to 60%.

3. The holding device according to claim 1, wherein the porous body does not include an excessively large space in which the pores are connected over a length of greater than or equal to 120 μm in one direction substantially perpendicular to the first surface of the holding device.

* * * * *